US007579860B2

(12) United States Patent
Deken

(10) Patent No.: US 7,579,860 B2
(45) Date of Patent: Aug. 25, 2009

(54) DIGITAL BANDGAP REFERENCE AND METHOD FOR PRODUCING REFERENCE SIGNAL

(75) Inventor: Richard Deken, Madison, MS (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/592,411

(22) Filed: Nov. 2, 2006

(65) Prior Publication Data

US 2008/0122669 A1 May 29, 2008

(51) Int. Cl.
*G01R 31/00* (2006.01)

(52) U.S. Cl. ....................................... 324/770; 323/314

(58) Field of Classification Search ................. 323/314, 323/315; 374/178, 170; 324/770
See application file for complete search history.

(56) References Cited

U.S. PATENT DOCUMENTS 5,867,054 A * 2/1999 Kotowski .................... 327/513
6,075,407 A 6/2000 Doyle
6,590,372 B1 7/2003 Wiles, Jr.
7,225,099 B1 * 5/2007 O'Dwyer .................... 702/130
2003/0071683 A1 * 4/2003 Shau .......................... 329/347
2004/0085086 A1 * 5/2004 LeChevalier ................ 324/770
2004/0155840 A1 * 8/2004 Abe et al. ..................... 345/76
2006/0093016 A1 * 5/2006 McLeod et al. ............. 374/178
2008/0095213 A1 * 4/2008 Lin et al. .................... 374/170

* cited by examiner

*Primary Examiner*—Akm E Ullah
*Assistant Examiner*—Nguyen Tran
(74) *Attorney, Agent, or Firm*—Ingrassia, Fisher & Lorenz. P.C.

(57) ABSTRACT

A system and method (400) for producing a reference signal is provided. The method includes supplying (405) a first current to a diode, sampling (410) a first voltage across the diode, supplying (405) a second current to the diode, sampling (410) a second voltage across the diode, converting (415) the first voltage and the second voltage to a first digital value and a second digital value, and determining (420) a digital reference value from the first digital value and the second digital value. The first voltage is based on the first current, and the second voltage is based on the second current.

19 Claims, 3 Drawing Sheets

DIGITAL BANDGAP REFERENCE AND METHOD FOR PRODUCING REFERENCE SIGNAL

FIELD OF THE INVENTION

The present invention generally relates to signal conversion, and more particularly relates to a circuit and method for producing a reference signal.

BACKGROUND OF THE INVENTION

Systems that manipulate analog, digital, or mixed signals generally use a reference potential for a variety of operations. For example, a conventional analog-to-digital converter (ADC) system usually includes a reference circuit, relying on a reference potential, to establish a range for signal conversion. The reference potential should be reproducible to provide consistent performance.

One manner of obtaining the reference potential is with a reference based on the bandgap energy of a semiconductor material. By applying a reference current to two diodes or p-n junction devices having different diode areas and measuring the voltage drops across such devices, the bandgap energy of the diode semiconductor (e.g., silicon) may be determined. The measured bandgap energy is generally a physical constant, although the bandgap energy may drift in response to temperature. This measurement is typically performed in the analog domain and may be inaccurate due to device mismatch (e.g., non-ideal devices or devices having non-uniform properties as a result of the manufacturing process thereof). For example, variations in the circuits supplying the reference currents to the diodes and device mismatch can cause as much as a five-percent (5%) variation in the reference potential determination.

Accordingly, a method and a circuit for producing a reference signal having improved accuracy are desired. In addition, a method and a circuit for producing a reference signal having improved accuracy and that can be used with a varying reference are desired. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description.

According to various embodiments, methods and circuits are provided for producing a reference signal. Generally, two different currents are alternately supplied (e.g., by a current mirror circuit) to a diode, and a voltage drop ($V_{be}$) is measured across the diode for each of the currents. The term "diode" refers to a forward-biased p-n junction and may include one or more diode devices. Although the reference signal is preferably based on the voltage drop across a diode, other semiconductor devices having a p-n junction with a predictable voltage versus temperature behavior may be used, such as a transistor and the like. The voltage measurements are converted to a digital value (e.g., by an analog-to-digital converter (ADC)), and a constant is derived, in the digital domain, from the voltage measurements. The constant (e.g., a digital reference value) is a digital representation of a voltage based on the bandgap voltage of the diode and can be converted to a voltage (e.g., by a digital-to-analog converter (DAC)) that may be used to determine a reference signal. The digital constant and the reference signal are substantially invariant to changes in process and temperature as well as variations in the reference that may be used to supply the components of the circuit. Additionally, the digital constant may be used to trim the reference.

Figure 1:
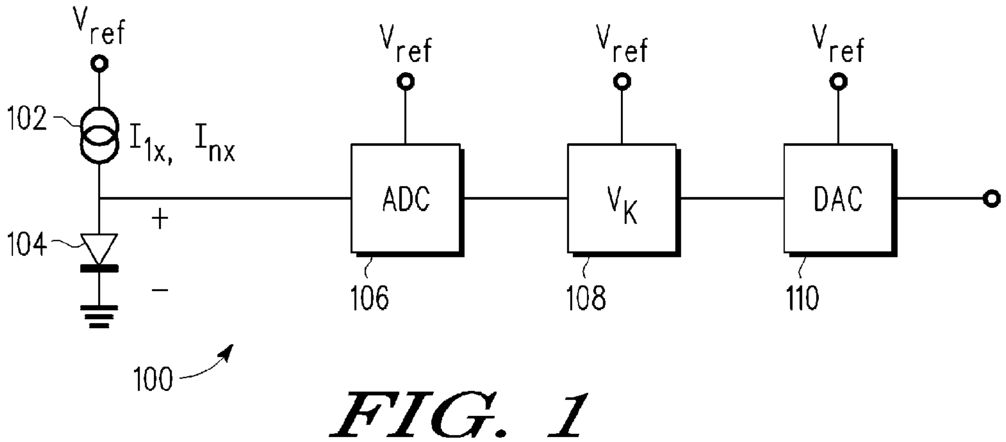
FIG. 1 is a block diagram of a bandgap reference circuit in accordance with an exemplary embodiment of the present invention.

Referring to the drawings, FIG. 1 is a block diagram of a bandgap reference circuit 100 in accordance with an exemplary embodiment of the present invention. Bandgap reference circuit 100 comprises a current source 102, a diode 104 coupled to an output of current source 102, an ADC 106 having an input coupled to diode 104, a processor 108 (e.g., microprocessor, controller, or other type of processor or logic implemented circuit) having an input coupled to an output of ADC 106, and a DAC 110 coupled to an output of processor 108. Each of current source 102, ADC 106, and DAC 110 are coupled to a reference (e.g., for receiving reference potential ($V_{ref}$)). Current source 102 alternates or rotates supplying two different currents to diode 104, which produces two different voltage drops across diode 104 corresponding with the currents. A constant (K) is determined by processor 108, in the digital domain, from samples of the voltage drop across diode 104, and the constant (K) is converted to a voltage by DAC 110. The constant (K) represents a ratio of the bandgap voltage ($V_K$) to $V_{ref}$. The constant (K) may also be used to determine a percentage of $V_{ref}$ for generating the bandgap voltage ($V_K$) and can be used for calibrating a gain for other analog measurements.

In this exemplary embodiment, current source 102 (e.g., a multi-output current mirror) alternates supplying different currents (e.g., $I_{1x}$ and $I_{nx}$) to diode 104 after a pre-determined time period and may include a switch or other device (not shown) to rotate supply of the currents to diode 104. For example, a first current is supplied to diode 104 by coupling one or more outputs of a multi-output current mirror to diode 104, and a second current is supplied to diode 104 by coupling a combination of other outputs of the multi-output current mirror to diode 104. Although two different currents are sampled and used to determine the constant ($V_K$) in bandgap reference circuit 100, multiple currents from current source 102 may be sourced to diode 104 for multiple voltage samples by ADC 106. In this example, different current densities associated with the outputs (or combinations of outputs) of the multi-output current mirror are utilized to supply the different currents. The transistors of current source 102 may have different current densities based on the configuration of current source 102. For example, each of the transistors of the current mirror may be selected to have a predetermined geometry (e.g., diode or emitter area) corresponding with the desired current densities. Other devices may also be used to supply currents to diode 104.

The current supplied to diode 104 produces a voltage drop ($V_{BE}$) across diode 104, and ADC 106 is a single-input converter that samples the voltage drop ($V_{BE}$) across diode 104. To compensate for an inaccurate reference (e.g., an inaccurate reference potential ($V_{ref}$)), bandgap reference circuit 100 is configured such that current is supplied to diode 104 using a known ratio between two different current densities (e.g., each current density associated with the corresponding selected output of current generating circuit 102). In one embodiment, ADC 106 is a switched capacitor type ADC, although other ADC types may be used. For example, ADC 106 samples a first voltage drop across diode 104 associated with a first current density (e.g., $V_{BE}(I_{1x})$) and samples a second voltage drop across diode 104 associated with a second current density (e.g., $V_{BE}(I_{nx})$). The voltage samples are converted to a digital representation by ADC 106 and supplied to processor 108. Processor 108 performs a digital computation, $$V_K = V_{BE}(I_{1x}) + G[V_{BE}(I_{nx}) - V_{BE}(I_{1x})], \quad \text{(eq. 1)}$$

where G is a gain, to determine the ($V_K$). The gain (G) is a fixed gain (e.g., in normal practice, G is usually about six (6)) to produce the constant ($V_K$). Thus, a digital constant is generated that represents a fixed voltage by measuring the voltage drops ($V_{BE}$) across diode 104 at two current densities. By periodically switching the supply of the different currents to diode 104 and periodically sampling the voltage drop across diode 104, $V_K$ may be continuously determined, in the digital domain, to account for potential temperature or reference drift.

DAC 110 converts the digital constant (K) to a voltage. The resulting voltage is substantially accurate with respect to process variations and temperature variations. The constant (K) may be derived from this voltage using $$V_K = K \times V_{ref} \quad \text{(eq. 2)}$$

As previously mentioned, the constant K is a ratio of the bandgap voltage $V_K$ to $V_{ref}$ and can be scaled to any reference value. Constant K thus represents the scaling of $V_{ref}$ that may be used for process-dependent effects on bandgap reference circuit 100 and may be used to determine other voltage measurements with greater accuracy.

Using a single diode and rotating different currents supplied to the diode significantly reduces accuracy error due to device mismatch and improves the accuracy for a relatively small die space. For example, a single diode variation can be more accurate than ±2%. Additionally, many mixed signal systems already include a 10 to 12 bit analog-to-digital "house-keeping" converter to implement the features of the system. In one embodiment, bandgap reference circuit 100 may be configured to re-use this "house-keeping" ADC to generate the digital constant (K), which would reduce implementation area requirement of bandgap reference circuit 100.

Further, as manufacturing process geometries reduce die sizes, many of the devices, such as resistors and transistors which typically require device matching, tend to occupy a disproportionate amount of area on the die. When these manufacturing processes approach a quarter of a micron or smaller, it is generally more cost efficient to perform more and more functions, normally associated with the analog domain, in the digital domain. By producing the digital constant (K) in the digital domain, cost-efficiency is improved with bandgap reference circuit 100.

Figure 2:
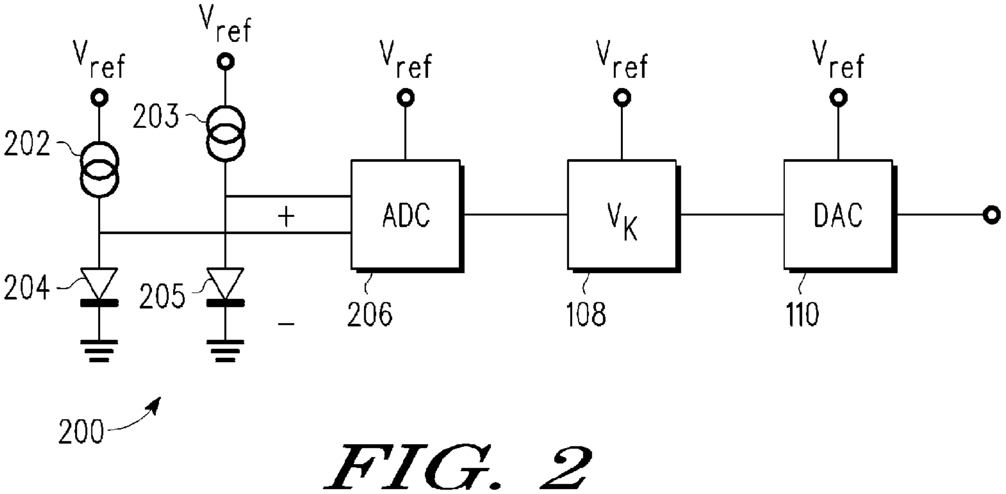
FIG. 2 is a block diagram of a bandgap reference circuit in accordance with another exemplary embodiment of the present invention.

FIG. 2 is a block diagram of a bandgap reference circuit 200 in accordance with another exemplary embodiment of the present invention. In this exemplary embodiment, multiple current sources supply different currents to multiple diodes, and the resulting voltage drops across diodes 204, 205 are sampled and used to determine the digital constant (K) in the digital domain and the constant ($V_K$) in the analog domain. Bandgap reference circuit 200 comprises current sources 202 and 203, a first diode 204 coupled to an output of current source 202, a second diode 205 coupled to an output of current source 203, an ADC 206 having a first input coupled to diode 204 and a second input coupled to diode 205, processor 108 coupled to an output of ADC 206, and DAC 110 coupled to processor 108. Each of current sources 202 and 203, ADC 206, processor 108, and DAC 110 are coupled to reference ($V_{ref}$).

In one embodiment, current source 202 alternates or rotates supplying different currents to diode 204, and current source 203 alternates or rotates supplying different currents to diode 205. For example, current source 202 rotates supplying current ($I_{1x}$) and current ($I_{nx}$) to diode 204, and current source 203 rotates supplying current ($I_{nx}$) and current ($I_{1x}$) to diode 205. Although current sources 202 and 203 rotate or selectively provide two different currents, additional currents may be supplied in rotation. Current sources 202 and 203 may be similar to current source 102 shown in FIG. 1, such as multi-output current mirrors, although other current generating devices may be used. The different currents for each of current sources 202 and 203 may be selected based on the different current densities associated with the transistors in a current mirror. For example, a first current is supplied to diode 204 by coupling one output of a first current mirror to diode 204, and a second current is supplied to diode 204 by coupling a combination of other outputs of the first current mirror to diode 204. Similarly, a first current is supplied to diode 205 by coupling one output of a second current mirror to diode 205, and a second current is supplied to diode 205 by coupling a combination of other outputs of the second current mirror to diode 205. The different currents (e.g., $I_{1x}$ and $I_{nx}$) supplied to diodes 204 and 205 may be periodically rotated based on a predetermined time period (e.g., based on the conversion rates of ADC 206 and DAC 110, and/or the period for determining K by processor 108).

The different currents supplied to diodes 204 and 205 produce voltage drops across diodes 204 and 205. ADC 206 is a differential type ADC and alternates sampling the voltage drop across diode 204 or diode 205 and directly sampling the difference (e.g., differential) between the two voltage drops across diodes 204 and 205. The voltage drops (e.g., $V_{BE}(I_{1x})$ and $V_{BE}(I_{nx})$) across diodes 204 and 205 correspond to the different supplied currents. For example, during a first sampling period, ADC 206 samples a voltage drop ($V_{BE}(I_{1x})$) across diode 204 resulting from current ($I_{1x}$) (e.g., supplied by current source 202) or a voltage drop ($V_{BE}(I_{1x})$) across diode 205 resulting from current ($I_{nx}$) (e.g., supplied by current source 203). During a second sampling period, ADC 206 samples the difference in the voltage drop ($V_{BE}(I_{1x})$) across diode 204 resulting from current ($I_{1x}$) (e.g., supplied by current source 202) and the voltage drop ($V_{BE}(I_{nx})$) across diode 205 resulting from current ($I_{nx}$) (e.g., supplied by current source 203). In this embodiment, the difference between the voltage drops across diodes 204 and 205 can be directly measured using ADC 206, which further reduces ADC error. By alternating currents supplied by current sources 202 and 203, $V_{BE}$ offset errors may be removed from the ADC samples. Further, rotating combinations of different current source outputs used to generate the two currents can remove mismatch errors in the current source outputs.

Using the sampled voltage drops ($V_{BE}$), the digital constant (K) is determined in the digital domain by processor 108 (e.g., using eq. 1) and converted to a voltage by DAC 110. The constant $V_K$ may be determined in the analog domain (e.g., using eq. 2). By periodically rotating the supply of the different currents to diodes 204 and 205 and periodically sampling the voltage drop across diodes 204 and 205, K may be continuously determined, in the digital domain, to account for potential temperature or reference drift while reducing $V_{BE}$ offset and current source output mismatch errors may be removed from the ADC samples.

Bandgap reference circuit 100, 200 may be implemented in a variety of mixed signal products that incorporate analog circuits and one or more components utilizing digital processing, such as automobiles, industrial applications, portable electronic devices, wireless communication devices, computer systems, and the like.

Figure 3:
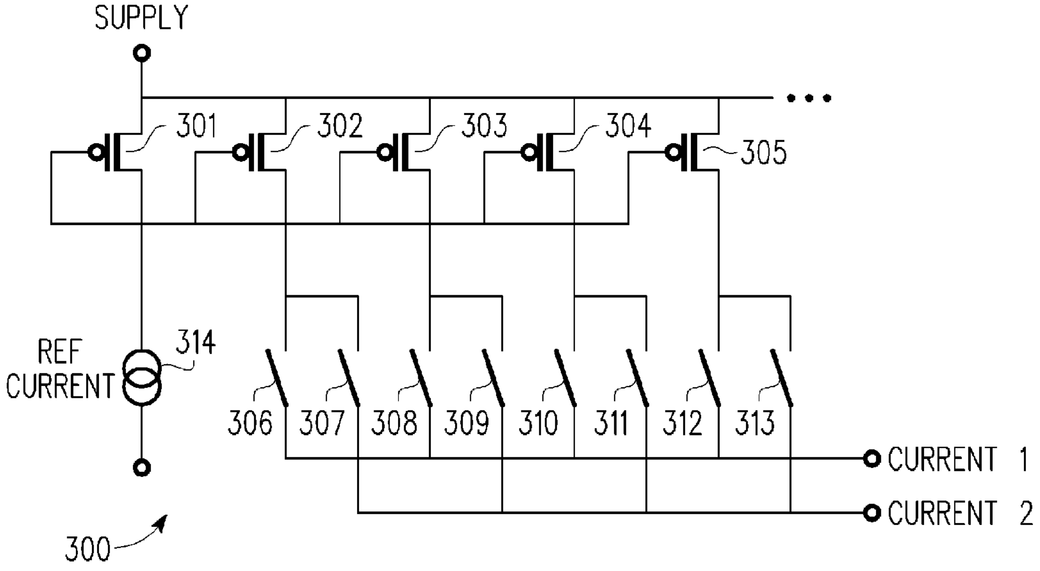
FIG. 3 is a circuit diagram of a multi-output current source.

FIG. 3 is a circuit diagram of a multi-output current source 300. Current source 300 is a current mirror comprising a supply input (e.g., to receive a voltage supply or current supply), at least two current outputs (e.g., Current 1 and Current 2), one or more transistors 301, 302, 303, 304, 305, and one or more switches 306, 307, 308, 309, 310, 311, 312, 313 coupled to transistors 301, 302, 303, 304, 305. Current source 300 is one example of an embodiment of current source 102, 202, 203. For example, the current outputs (Current 1 and Current 2) may be coupled to diodes 104, 204, and 205. Current source 300 may additionally include a reference current device 314 coupled to transistor 301. Each of transistors 301, 302, 303, 304, 305 provides an output for supply current having a current density associated with the corresponding transistor.

In this embodiment, switches 306, 307, 308, 309, 310, 311, 312, 313 may be selectively activated to combine a variety of outputs (e.g., corresponding to one or more of transistors 301, 302, 303, 304, 305). The output combinations supply a desired current output (Current 1 and Current 2) for current source 300. These combinations may be rotated for consecutive ADC samples to remove current source output mismatch errors from the ADC samples. Current source 300 may have a variety of configurations (e.g., more or less transistors and more or less switches).

Figure 4:
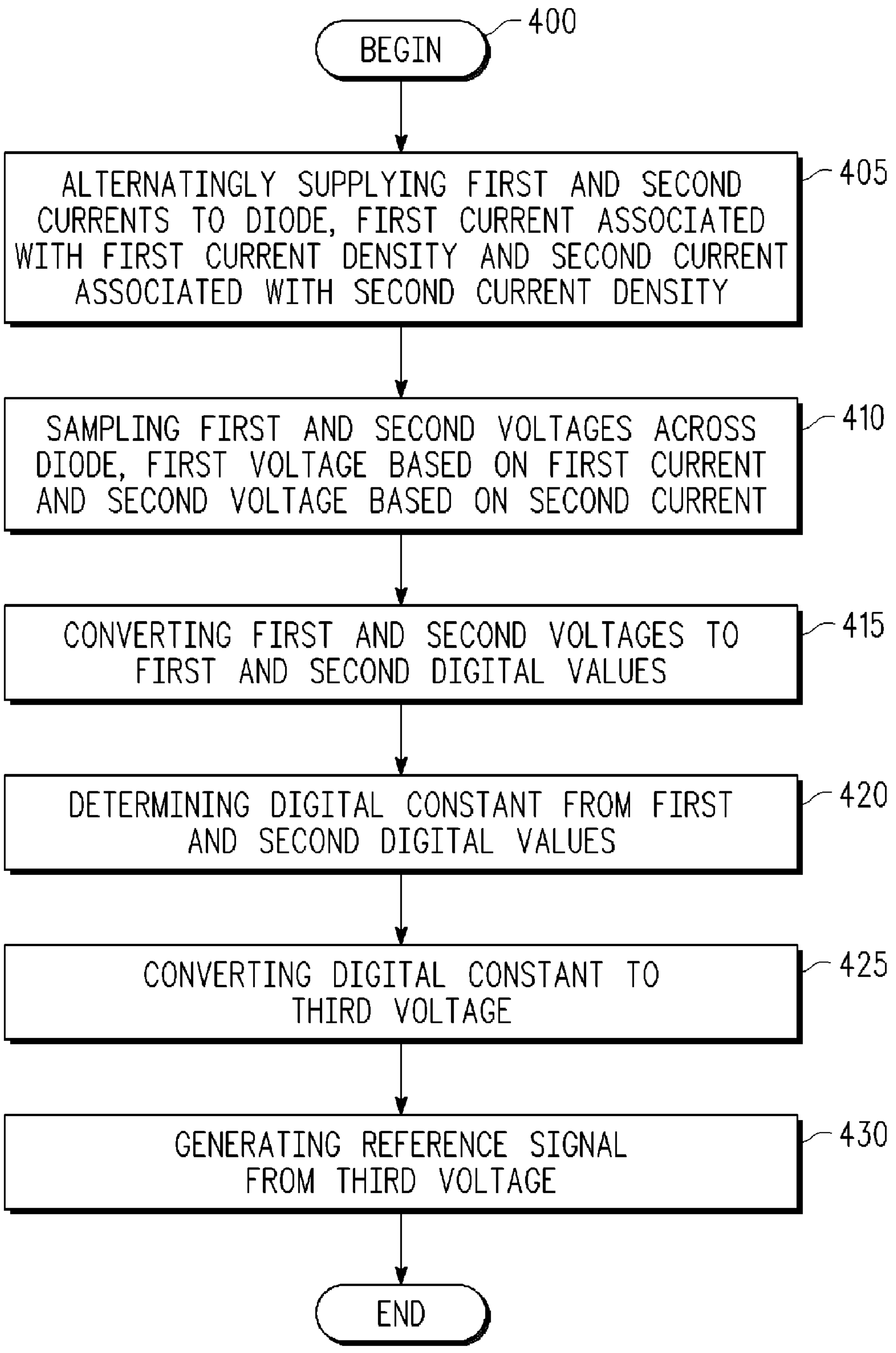
FIG. 4 is a flow diagram of a method for producing a reference signal in accordance with an exemplary embodiment of the present invention.

FIG. 4 is a flow diagram of a method 400 for producing a reference signal in accordance with an exemplary embodiment of the present invention. First and second currents (e.g., $I_{1x}$ and $I_{nx}$) are supplied to a diode, as indicated at step 405. Each of the first and second currents is associated with a different current density. In one embodiment, the first current ($I_{1x}$) is supplied to diode 104 via a first output of current source 102, and the second current ($I_{nx}$) is supplied to diode 104 via a second output of the current source 102. The first output of current source 102 has a first current density associated therewith, and the second output of the current source 102 has a second current density associated therewith. During operation, current source 102 may continuously alternate supplying the first and second currents (e.g., alternate coupling diode 104 to one output of current source 102 with one or more other outputs of current source 102) to diode 104. In another embodiment, current source 102 rotates supplying multiple currents (e.g., based on different output combinations of current source 102) to diode 104.

First and second potentials are sampled across the diode, as indicated at step 410. The first potential (e.g., $V_{BE}(I_{1x})$) is based on the first current (e.g., $I_{1x}$) and the second potential (e.g., $V_{BE}(I_{nx})$) is based on the second current (e.g., $I_{nx}$). In one embodiment, ADC 106 alternates a sampling of the first potential across diode 104 with a sampling of the second potential across diode 104 in coordination with the alternating supply of the currents by current source 102. The first and second potentials are converted to first and second digital signals, respectively, as indicated at step 415. For example, ADC 106 converts each of the sampled potentials ($V_{BE}(I_{1x})$ and $V_{BE}(I_{nx})$) to digital representations.

A constant is determined from the first and second digital signals in the digital domain, as indicated at step 420. For example, the constant ($V_K$) is determined by solving for $$V_K = V_{BE}(I_{1x}) + G[V_{BE}(I_{nx}) - V_{BE}(I_{1x})],$$

where $V_{BE}(I_{1x})$ is the first potential, $V_{BE}(I_{nx})$ is the second potential, and G is a predetermined gain. This constant (e.g., $V_K$) is converted to an analog value (e.g., a voltage), as indicated at step 425. In one embodiment, the analog value is a process dependent constant based on current source 102. The reference signal is generated from the analog constant, as indicated at step 430. For example, a bandgap reference potential is generated from the voltage corresponding to the constant ($V_K$). A measurement of an analog potential may be calibrated using this analog value and without using circuit trim.

Figure 5:
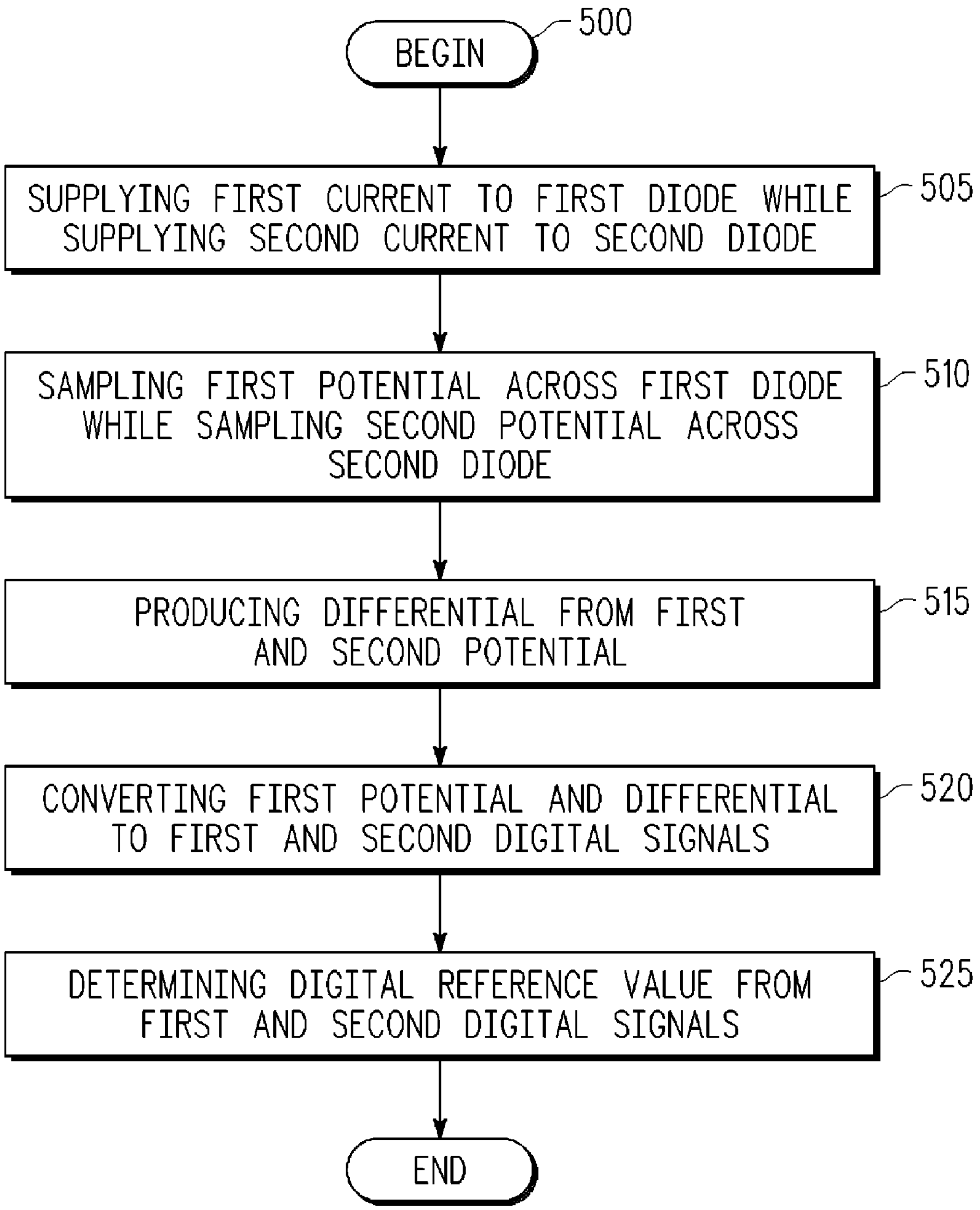
FIG. 5 is a flow diagram of a method for producing a reference signal in accordance with another exemplary embodiment of the present invention.

FIG. 5 is a flow diagram of a method 500 for producing a reference signal in accordance with another exemplary embodiment of the present invention. A first current is supplied to a first diode and a second current is supplied to a second diode, as indicated at step 505. In one embodiment, the first current (e.g., $I_{1x}$) is supplied to diode 204 via a first output of current source 202 while the second current (e.g., $I_{nx}$) is supplied to diode 205 via a first output of current source 203. The first output of current source 202 has a first current density associated therewith, and the first output of current source 203 has a second current density associated therewith. Each of the first and second currents (e.g., $I_{1x}$ and $I_{nx}$) is associated with a different current density (e.g., corresponding to different selected outputs of a current mirror). In another embodiment, the first current ($I_{1x}$) is supplied to diode 204 via a first output of current source 202 while supplying the second current ($I_{nx}$) to diode 205 via a first output of current source 203. Then, the second current ($I_{nx}$) is supplied to diode 204 via the second output of current source 202 while supplying the first current ($I_{1x}$) to diode 205 via the first output of current source 203. These current supplies may be alternated.

A first potential is sampled across the first diode and a second potential is sampled across the second diode, as indicated at step 410. The first potential (e.g., $V_{BE}(I_{1x})$) is based on the first current (e.g., $I_{1x}$), and the second potential (e.g., $V_{BE}(I_{nx})$) based on the second current (e.g., ($I_{nx}$)). For example, ADC 206 (e.g., a differential input ADC) may be used to sample the potentials (e.g., $V_{BE}(I_{1x})$ and $V_{BE}(I_{nx})$) across diodes 204 and 205. A differential signal is produced from the first and second potentials, as indicated at step 515. For example, a differential is produced by ADC 206 from the first and second potentials. One of the first and second potentials is converted to a first digital signal and the differential is converted to a second digital signal as indicated at step 520. A digital constant (e.g., digital reference value) is determined from the first and second digital signals, as indicated at step 525. The digital constant may be converted to an analog value (e.g., a voltage), and the reference signal may be generated from the analog value. For example, a bandgap reference potential may be generated from the analog value.

In one exemplary embodiment, a method for producing a reference signal is provided comprising the steps of supplying a first current to a diode, sampling a first voltage across the diode, supplying a second current to the diode, sampling a second voltage across the diode, converting the first voltage and the second voltage to a first digital value and a second digital value, and determining a digital reference value from the first digital value and the second digital value. The first voltage is based on the first current, and the second voltage is based on the second current. The method may further comprise converting the digital reference value to a third voltage based on a conversion reference. The first voltage and the second voltage may be converted to the first digital value and the second digital value based on the conversion reference. The method may further comprise generating the reference signal from the third voltage. In one embodiment, a bandgap reference voltage is generated from third voltage. In another embodiment, the first current is associated with a first current density and the second current is associated with a second current density. In another embodiment, the first current may be supplied to the diode via a first output of a current generating circuit, and the second current may be supplied to the diode via a second output of the current generating circuit. The first output of the current generating circuit has a first current density associated therewith, and the second output of the current generating circuit having a second current density associated therewith. In another embodiment, the digital reference value ($V_K$) is solved from $V_K=V_{BE}(I_{1x})+G[V_{BE}(I_{nx})-V_{BE}(I_{1x})]$, where $V_{BE}(I_{1x})$ is the first voltage, $V_{BE}(I_{nx})$ is the second voltage, and G is a gain.

In another exemplary embodiment, a method for producing a reference signal is provided comprising the steps of supplying a first current to a first diode while supplying a second current to a second diode, sampling a first potential across the first diode while sampling a second potential across the second diode, producing a differential from the first and second potentials, converting the first potential and the differential to first and second digital signals, and determining a digital reference value from the first and second digital signals. The method may further comprise converting the digital reference value to a third voltage based on a conversion reference. The first potential and the differential may be converted to first and second digital signals based on the conversion reference. The method may further comprise generating the reference signal from the third voltage. In one embodiment, a bandgap reference potential is generated from the third voltage. In another embodiment, the first current is supplied to the first diode via a first output of a current generating circuit while the second current is supplied to the second diode via a second output of the current generating circuit. The first output has a first current density associated therewith, and the second output has a second current density associated therewith. In another embodiment, a third current is supplied to the first diode via a third output of the current generating circuit while a fourth current is supplied to the second diode via a fourth output of the current generating circuit. In another embodiment, the first current is supplied to the first diode via a first output of a first current generating circuit while the second current is supplied to the second diode via a first output of a second current generating circuit. In this embodiment, a third current may be supplied to the first diode via a second output of the first current generating circuit while a fourth current is supplied to the second diode via a second output of the second current generating circuit.

In another exemplary embodiment, a circuit is provided for generating a reference signal comprising a first diode configured to receive at least a first current and a second current, a sampling input coupled to the first diode, and a processing circuit configured to determine a digital reference value based on the first potential and the second potential. The sampling input provides a first potential based on the first current and a second potential based on the second current. The first current is associated with a first current density and the second current is associated with a second current density. In one embodiment, the circuit may further comprise an analog-to-digital converter (ADC) having an input coupled to the sampling input and having an output coupled to the processing circuit. The ADC is configured to provide a first digital representation of the first potential and a second digital representation of the second potential. The processing circuit is further configured to determine said digital reference value based on the first digital representation and the second digital representation. In another embodiment, the circuit may further comprise a current mirror having first and second outputs. The first output of the current mirror has a first current density associated therewith, and the second output of the current mirror has a second current density associated therewith. The current mirror is configured to supply the first current via the first output of the current mirror and further configured to supply the second current via the second output of the current mirror. In another embodiment, the circuit may further comprise a current mirror having a plurality of outputs. The current mirror is configured to supply the first current based on a first combination of the plurality of outputs having a first current density associated therewith and supply the second current based on a second combination of the plurality of outputs having a second current density associated therewith. In this embodiment, the current mirror may be further configured to rotate supplying a plurality of currents to the first diode. Each of the plurality of currents is based on a different combination of the plurality of outputs, and each of the plurality of currents has a current density associated therewith. In another embodiment, the circuit further comprises a second diode configured to receive at least a third current, and a second sampling input coupled to the second diode. The second sampling input providing a third potential based on the third current. The processing circuit may be further configured to determine the digital reference value based on the first potential and a differential between the first potential and the third potential. The processing circuit may further comprise an ADC having an input coupled to the first sampling input and the second sampling input and having an output coupled to the processing circuit. The ADC is configured to provide a first digital representation of the first potential and a second digital representation of a differential between the first potential and the third potential. The processing circuit is further configured to determine the digital reference value based on the first digital representation and the second digital representation. In another embodiment, the processing circuit may further comprise a current mirror having a plurality of outputs and configured to rotate supplying a first plurality of currents to the first diode and rotate supplying a second plurality of currents to the second diode. Each of the first plurality of currents is based on a different combination of the plurality of outputs of the current mirror, and each of the first plurality of currents has a current density associated therewith. Each of the second plurality of currents is based on a different combination of the plurality of outputs of the current mirror, and each of the second plurality of currents has a current density associated therewith. In another embodiment, the circuit further comprises a reference potential supply coupled to each of the ADC and the DAC. The reference potential supply may be inaccurate.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for producing a reference signal, the method comprising the steps of:

supplying a first current to a diode;

sampling a first voltage across the diode to produce a first digital value, $V_{BE}$(I1x), wherein the first voltage is based on the first current;

supplying a second current to the diode, wherein the first current and the second current have different current densities;

sampling a second voltage across the diode to produce a second digital value, $V_{BE}$(Inx), wherein the second voltage is based on the second current;

computing a bandgap voltage, $V_k$, of the diode from the first digital value and the second digital value as $$V_K = V_{BE}(I1x) + G[V_{BE}(Inx) - V_{BE}(I1x)],$$

wherein G is a fixed gain;

determining a digital reference value, K, as a ratio of the bandgap voltage and a reference voltage; and converting the digital reference value to an analog voltage for use in producing the reference signal.

2. A method according to claim 1, wherein converting the digital reference value to the analog voltage comprises converting the digital reference value based on a reference potential.

3. A method according to claim 2, further comprising generating the reference signal from the analog voltage.

4. A method according to claim 1, wherein the first current is associated with a first current density and the second current is associated with a second current density.

5. A method according to claim 1, wherein said step of supplying a first current comprises supplying the first current to the diode via a first output of a current generating circuit, the first output of the current generating circuit having a first current density associated therewith; and wherein said step of supplying a second current comprises supplying the second current to the diode via a second output of the current generating circuit, the second output of the current generating circuit having a second current density associated therewith.

6. A method for producing a reference signal, the method comprising the steps of:

supplying a first current by a first current generating circuit to a first diode while supplying a second current by a second current generating circuit to a second diode, wherein the first current and the second current have different current densities;

sampling a first potential across the first diode to produce a first digital signal, $V_{BE}$(I1x), while sampling a second potential across the second diode to produce a second digital signal, $V_{BE}$(Inx);

producing a differential from the first and second potentials;

computing a bandgap voltage, $V_K$, from the first and second digital signals as $$V_K = V_{BE}(I1x) + G[V_{BE}(Inx) - V_{BE}(I1x)],$$

wherein G is a fixed gain;

determining a digital reference value, K, as a ratio of the bandgap voltage and a reference voltage; and converting the digital reference value to an analog voltage for use in producing the reference signal.

7. A method according to claim 6, wherein converting the digital reference value to the analog voltage comprises converting the digital reference value based on a reference potential.

8. A method according to claim 7, further comprising generating the reference signal from the analog voltage.

9. A method according to claim 6, wherein said step of supplying a first current comprises supplying the first current to the first diode via a first output of the first current generating circuit while supplying the second current to the second diode via a first output of the second current generating circuit, the first output of the first current generating circuit having a first current density associated therewith, and the first output of the second current generating circuit having a second current density associated therewith.

10. A method according to claim 9, further comprising supplying a third current by the first current generating circuit to the first diode via a second output of the first current generating circuit while supplying a fourth current by the second current generating circuit to the second diode via a second output of the second current generating circuit.

11. A method according to claim 6, wherein said step of supplying a first current comprises supplying the first current to the first diode via a first output of the first current generating circuit while supplying the second current to the second diode via a first output of the second current generating circuit.

12. A method according to claim 11, further comprising supplying a third current by the first current generating circuit to the first diode via a second output of the first current generating circuit while supplying a fourth current by the second current generating circuit to the second diode via a second output of the second current generating circuit.

13. A circuit for generating a reference signal, the circuit comprising:

a first diode configured to receive at least a first current and a second current from a first current generating circuit, to produce a first voltage drop across the first diode in response to the first current, and to produce a second voltage drop across the first diode in response to the second current;

an analog to digital converter (ADC) coupled to said first diode, said ADC configured to provide a first digital value, $V_{BE}$(I1x), based on said first voltage drop and a second digital value, $V_{BE}$(Inx), based on said second voltage drop; and a processing circuit configured to compute a bandgap voltage, $V_K$, from the first digital value and the second digital value as $$V_K = V_{BE}(I1x) + G[V_{BE}(Inx) - V_{BE}(I1x)],$$

wherein G is a fixed gain, and to determine a digital reference value, K, as a ratio of the bandgap voltage and a reference voltage; and a digital to analog converter (DAC) coupled to said processing circuit, said DAC configured to convert the digital reference value to an analog voltage for use in generating the reference signal.

14. A circuit according to claim 13, wherein said first current is associated with a first current density and said second current is associated with a second current density.

15. A circuit according to claim 13, further comprising the first current generating circuit, which includes a current mirror having first and second outputs, said first output of said current mirror having a first current density associated therewith, a second output of said current mirror having a second current density associated therewith, said current mirror configured to supply said first current via said first output of said current mirror and further configured to supply said second current via said second output of said current mirror.

16. A circuit according to claim 13, further comprising the first current generating circuit, which includes a current mirror having a plurality of outputs, said current mirror configured to:

supply said first current based on a first combination of said plurality of outputs having a first current density associated therewith; and supply said second current based on a second combination of said plurality of outputs having a second current density associated therewith.

17. A circuit according to claim 16, wherein said current mirror is further configured to rotate supplying a plurality of currents to said first diode, each of said plurality of currents based on a different combination of said plurality of outputs, and each of said plurality of currents having a current density associated therewith.

18. A circuit according to claim 13, further comprising:

a second diode configured to receive at least a third current and a fourth current from a second current generating circuit, to produce a third voltage drop across the second diode in response to the third current, and to produce a fourth voltage drop across the second diode in response to the fourth current; and wherein the ADC is coupled to said second diode, said ADC configured to provide a third digital value based on said third voltage drop and a fourth digital value based on said fourth voltage drop; and wherein said processing circuit is further configured to compute the bandgap voltage from the first digital value, the second digital value, the third digital value, and the fourth digital value.

19. A circuit according to claim 13 further comprising a reference potential supply coupled to each of said ADC and said DAC, said reference potential supply being inaccurate.

* * * * *